United States Patent
van Schravendijk et al.

(10) Patent No.: US 6,720,251 B1
(45) Date of Patent: Apr. 13, 2004

(54) APPLICATIONS AND METHODS OF MAKING NITROGEN-FREE ANTI-REFLECTIVE LAYERS FOR SEMICONDUCTOR PROCESSING

(75) Inventors: Bart van Schravendijk, Sunnyvale, CA (US); Ming Li, Pleasanton, CA (US); Jason Tian, Milpitas, CA (US); Tom Mountsier, San Jose, CA (US); M. Zlaul Karim, San Jose, CA (US)

(73) Assignee: Novellus Systems, Inc., San Jose, CA (US)

( * ) Notice: Subject to any disclaimer, the term of this patent is extended or adjusted under 35 U.S.C. 154(b) by 0 days.

(21) Appl. No.: 09/990,197

(22) Filed: Nov. 21, 2001

Related U.S. Application Data

(60) Provisional application No. 60/302,112, filed on Jun. 28, 2001.

(51) Int. Cl.⁷ ............................................. H01L 21/205
(52) U.S. Cl. ...................................... 438/636; 438/790
(58) Field of Search .......................... 438/22, 780, 636, 438/952, 790; 257/98, 642

(56) References Cited

U.S. PATENT DOCUMENTS

| | | | |
|---|---|---|---|
| 6,051,282 A | 4/2000 | Konjuh et al. ............... 427/539 |
| 6,147,009 A * | 11/2000 | Grill et al. ................... 438/780 |
| 6,156,640 A | 12/2000 | Tsai et al. .................... 438/636 |
| 6,168,726 B1 | 1/2001 | Li et al. ........................ 216/79 |
| 6,174,816 B1 | 1/2001 | Yin et al. .................... 438/705 |
| 6,214,526 B1 | 4/2001 | Sundararajan et al. ....... 430/316 |
| 6,235,456 B1 | 5/2001 | Ibok ............................ 430/512 |
| 6,242,361 B1 | 6/2001 | Lee et al. .................... 438/710 |
| 6,251,770 B1 | 6/2001 | Uglow et al. ................ 438/624 |
| 6,316,167 B1 | 11/2001 | Angelopoulos et al. ..... 430/313 |
| 6,423,630 B1 * | 7/2002 | Catabay et al. ............. 438/624 |
| 2002/0155386 A1 * | 10/2002 | Xu et al. ..................... 430/312 |
| 2003/0030057 A1 * | 2/2003 | Bencher et al. ................ 257/77 |

FOREIGN PATENT DOCUMENTS

JP          60046563 A   *   3/1985 .......... G03G/5/082

* cited by examiner

*Primary Examiner*—Carl Whitehead, Jr.
*Assistant Examiner*—Jennifer M Dolan
(74) *Attorney, Agent, or Firm*—Beyer Weaver & Thomas LLP

(57) ABSTRACT

A nitrogen-free anti-reflective layer for use in semiconductor photolithography is fabricated in a chemical vapor deposition process, optionally plasma-enhanced, using a gaseous mixture of carbon, silicon, and oxygen sources. By varying the process parameters, acceptable values of the refractive index n and extinction coefficient k can be obtained. The nitrogen-free anti-reflective layer produced by this technique eliminates the mushrooming and footing problems found with conventional anti-reflective layers.

18 Claims, 5 Drawing Sheets

(a) 0.25um trench (b) 0.30um via

APPLICATIONS AND METHODS OF MAKING NITROGEN-FREE ANTI-REFLECTIVE LAYERS FOR SEMICONDUCTOR PROCESSING

CROSS-REFERENCE TO RELATED PATENT APPLICATIONS

This application claims priority under 35 U.S.C. 119(e) from U.S. Provisional Patent Application No. 60/302,112, filed Jun. 28, 2001, by Van Schravendijk et al., and titled NITROGEN FREE ANTI-REFLECTIVE LAYERS. This application is incorporated herein by reference for all purposes.

FIELD OF THE INVENTION

This invention relates to the manufacture of semiconductor devices as components of integrated circuits, specifically to processes for photolithography in which anti-reflective coatings are used to increase the accuracy of the photolithographic processing steps.

BACKGROUND OF THE INVENTION

In a dual damascene architecture, wiring patterns are etched into a dielectric, or insulating layer. See, e.g., Handbook of semiconductor interconnection technology, edited by Schwartz et al., Marcel Dekker 1998; and Copper—Fundamental Mechanisms for Microelectronic Applications, Murarka et al., Wiley 2000. The conductor material (typically copper) is then inlaid into those features. There are two types of features used for this purpose: trenches, which form the actual wiring template; and vias, which make connection to the metal level below. Creating such structures requires two passes through the photo-lithography process. Either the vias are formed first and then the trenches or vice versa.

The dielectric stack requirements for dual damascene include the primary insulating layer and a thin copper diffusion barrier or selective metal barrier. Additional layers may be included to facilitate fabrication, such as an intermediate etch stop, hard mask, etc.

An anti-reflective layer (or ARL) is often used for photolithographic processes. The ARL minimizes the total reflection of light from layers under the photoresist and the interface between the photoresist layer and the underlying layer. By adjusting the thickness, t, refractive index, n, and extinction coefficient, k, of the ARL film, as shown in FIG. 1, a destructive interference can be obtained in the photoresist with equivalent intensities of incident and reflective light. As a result, zero reflectivity can be reached under ideal conditions. Thus, an ARL improves the accuracy of pattern transfer when the photoresist is developed.

FIG. 2 show a schematic diagram of a simplified lithography process flow of the via-first dual damascene applications. Typically, anti-reflective layer 18 is deposited onto underlying layer 12, which is being patterned over the other film stack. Photoresist 10 is then spun onto top of the anti-reflective layer. See, FIG. 2(a). The process proceeds through (b) via photoresist development to (c) via etch to (d) via photoresist removal and cleaning to (e) or (e1) trench photoresist coating and (f) or (f1) trench photoresist development. The exposed portion of the photoresist layer 10 is removed when photoresist layer 10 is developed, yielding the clean vertical walls shown in FIG. 2(b) when UV radiation is incident on area of the top surface of photoresist layer 10, exposing a portion of the photoresist layer 10. When developed, the trench should be patterned properly and yielded vertical wall, as shown in FIG. 2(f).

However, this identity in pattern after the development step is not always realized. More specifically, silicon dioxide ($SiO_2$) historically has been used as the primary interconnect insulating layer. With device geometries shrinking and speeds increasing, the trend now is towards insulating materials with lower dielectric constants (low-k). One of the most persistent difficulties associated with the integration of the low-k film has been its interaction with photoresists used with deep UV radiation ("DUV", i.e., radiation having a wavelength of 248 nm and below). Low-k films often contain a small amount of nitrogen, present in the form of $NH_x$ (amines). The $NH_x$ species can diffuse rapidly through low-k dielectric films, such as would be used in layer 12. Such groups are known to react in a detrimental fashion with DUV photoresists by neutralizing the photo-acid catalyst. The result is footing or bridging of the printed features. These footings narrow the opening in the photoresist which results in poor pattern transfer to the underlying layers. See, FIG. 3.

To alleviate this phenomenon, a hard mask could be incorporated on top of the low-k film. This approach is very costly and is limited to hard masks that are barriers to the diffusion of amines (i.e., low k hard masks would not be suitable.) Moreover, the use of a hard mask will be effective only for single layer lithography; e.g., printing vias for via-first dual damascene, or trenches in the case of trench-first. However, after formation of those features into the dielectric, DUV resist would once again come in contact with low-k film during the next pass through lithography. The result would be regions of undeveloped resist in the second pass lithography features. For example, in the case of via-first patterning, the appearance of "mushrooms" or "rivet heads" over the vias (also filled with resist) in the trench regions. A DUV photoresist "mushroom" is illustrated schematically in FIG. 2(f1) and demonstrated in a SEM picture shown in FIG. 4.

Organic layers have been commonly used as ARLs for I-line radiation (i.e., radiation having a wavelength of 365 nm), although inorganic layers can also be used. Layers of inorganic materials such as silicon oxynitride are often used for deep UV radiation. For a discussion of the use of deep UV ARLs, see T. Ogawa et al.; "Practical Resolution Enhancement Effect By New Complete Anti-Reflective Layer In KrF Excimer Laser Lithography"; Optical/Laser Microlithography; Session VI; Vol. 1927 (1993), incorporated herein by reference. For a general discussion of the use of ARLs, see T. Perara, "Anti-Reflective Coatings: An Overview"; Solid State Technology, Vol. 37, No. 7; pp. 131–136 (1995), which is incorporated herein by reference.

There is a need for a simpler approach to deposit an ARL film with elimination of the photoresist footing problem and photoresist poisoning (mushroom) problem in dual damascene processes. It would be desirable for the ARL film to be optically and thermally stable, to be chemically inert to the environments to which it is exposed, and to be applicable for use with any wavelength of UV radiation. In addition, the ARL film should have good adhesion to commonly used materials and have good mechanical and structural integrity. Finally, it would be desirable to provide a single continuous process for producing the ARL film with acceptable uniformity across the wafer.

SUMMARY OF THE INVENTION

In accordance with this invention, a substantially nitrogen-free ARL is provided. The ARL is compatible with chemically amplified photoresists found in lithography processes using DUV radiation. It is effective in eliminating footing and inhibits the photoresist poisoning of the second layer of lithography in dual damascene applications.

The ARL can be formed using chemical vapor deposition (CVD), including, for example, plasma enhanced chemical vapor deposition (PECVD), low-pressure chemical vapor deposition, (LP-CVD), high-density plasma chemical vapor deposition (HDP-CVD), or similar methods under process conditions that are designed to provide an ARL having the desired properties. These properties principally include thickness (t), refractive index (n), and extinction coefficient (k), with the values of n and k being a function of the wavelength of the radiation.

The ARL is formed by introducing source gases or liquids comprising silicon, oxygen, carbon, and hydrogen into the reaction chamber of the CVD unit. In a particularly preferred embodiment, the ARL is formed from carbon dioxide and silane. The process conditions or parameters of this invention are principally the flow rate of the reactant gases, the volumetric ratio of the gaseous components, the deposition pressure, the deposition temperature, and the rate at which radio frequency (RF) power is applied in a PECVD unit (per unit area of the surface of the wafer or other substrate on which the ARL is formed).

BRIEF DESCRIPTION OF THE DRAWINGS

This invention will be better understood by reference to the following drawings and description, in which the same reference numerals are used to identify like components.

DESCRIPTION OF THE PREFERRED EMBODIMENT

Figure 1:
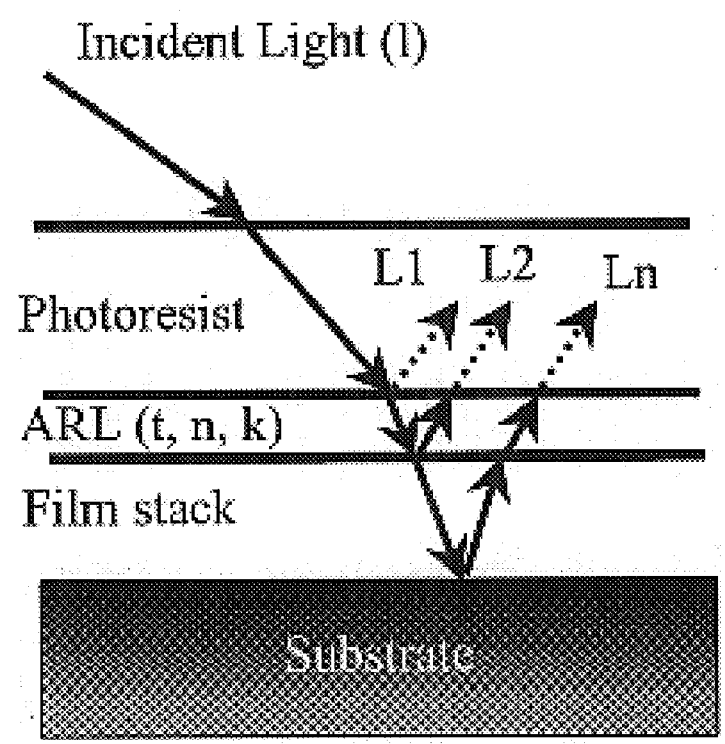
FIG. 1 is a schematic drawing illustrating how an ARL works. By adjusting the thickness, refractive index and extinction coefficient (t, n, k) of the ARL, destructive interference between the incident light and all of the reflective lights L1, L2, . . . Ln can be obtained within the photoresist. Preferably, with the appropriate conditions, a zero reflectivity can be reached in the photoresist.
Figure 2:
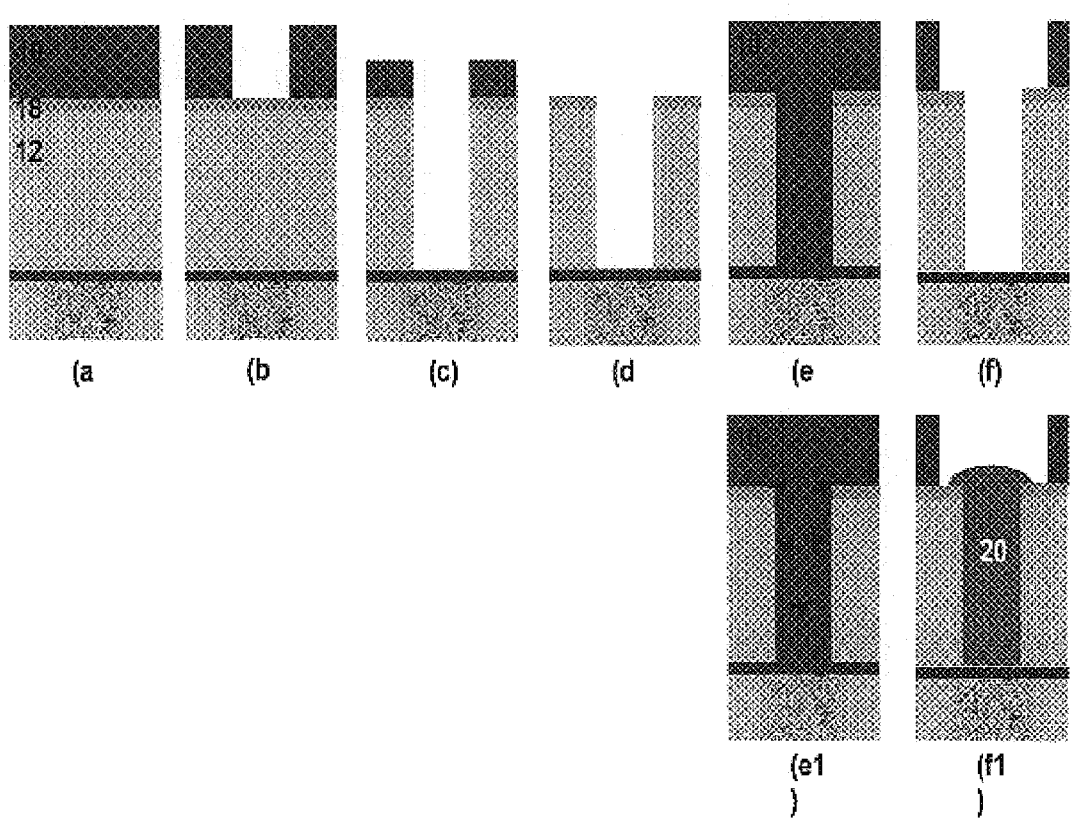
FIG. 2 shows a simplified lithography process flow of the via-first dual damascene applications. The process includes (a) via photoresist coating; (b) via photoresist development; (c) via etch; (d) via photoresist ash and cleaning; (e) or (e1) trench photoresist coating; and (f) or (f1) trench photoresist development.
Figure 3:
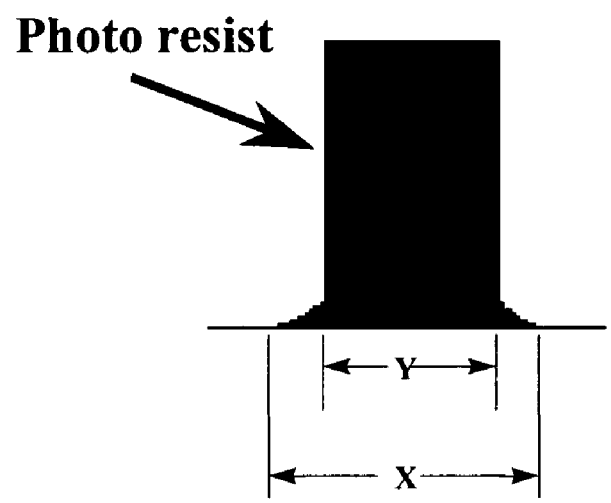
FIG. 3 is a schematic of photoresist footing in the lithography. The extent of footing can be quantified as (X–Y)/2. ARL and film stacks are underlying the photoresist.
Figure 4:
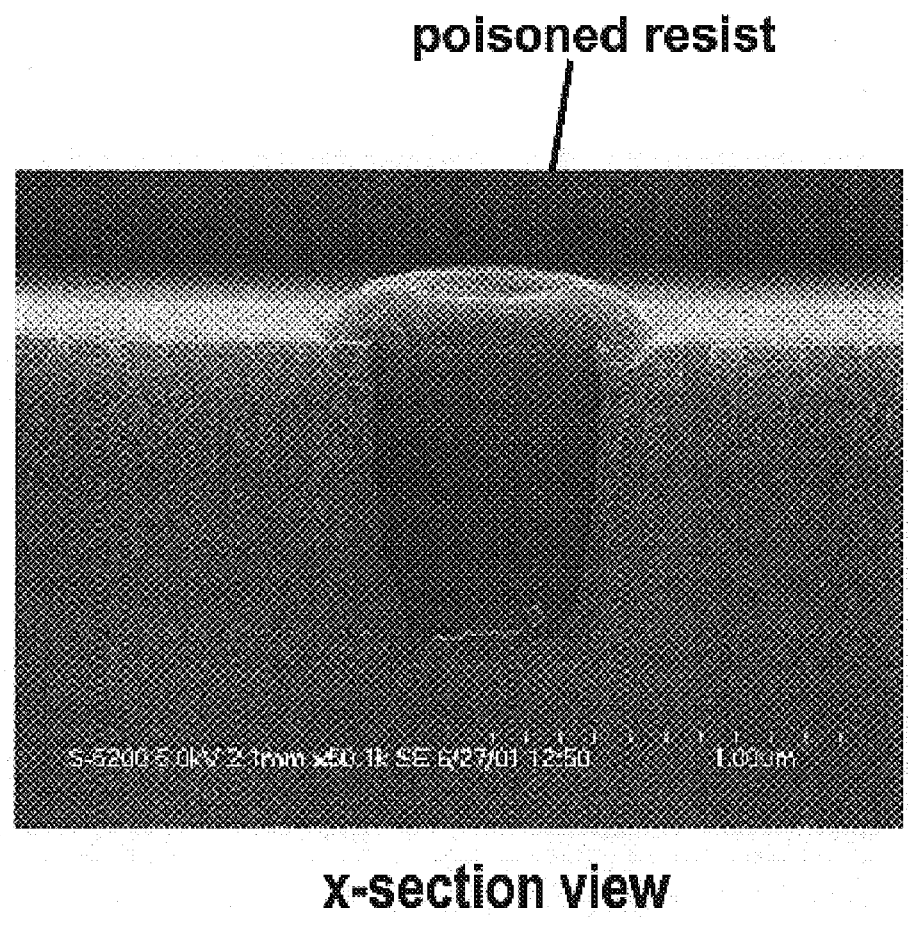
FIG. 4 is a scanning electron microscope (SEM) image of the photoresist poisoning and "mushroom" problem in the trench lithography for via-first dual damascene applications.
Figure 5:
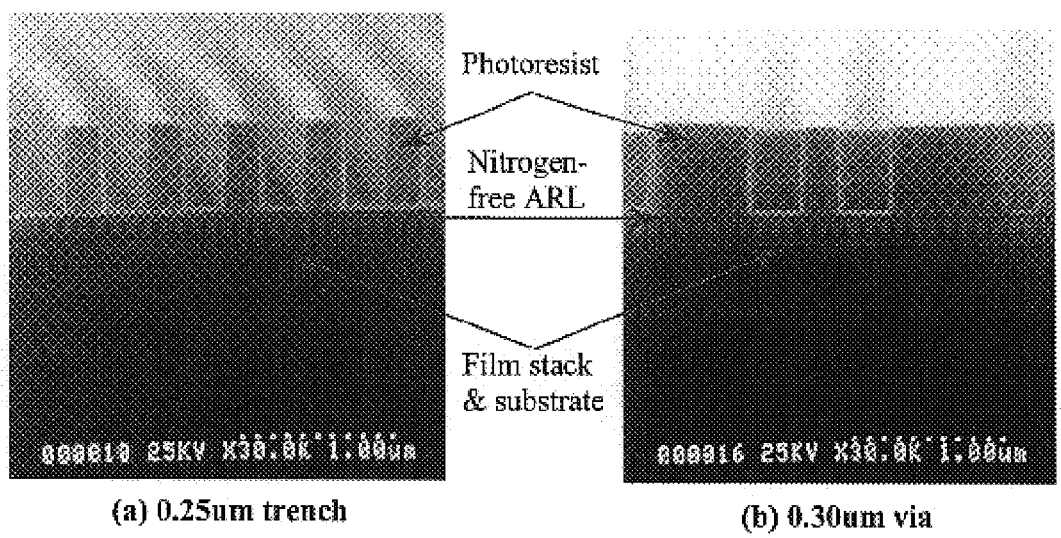
FIG. 5 is SEM images of DUV (248 nm) lithography using a nitrogen-free ARL of the present invention. Notably, no footing or mushrooming problems are evident.

The present invention provides a nitrogen-free anti-reflective layer for use in semiconductor photolithography. The ARL film can be fabricated in a chemical vapor deposition process, optionally plasma-enhanced, using a mixture of carbon, silicon, oxygen, and hydrogen sources. By varying the process parameters, acceptable values of the refractive index n and extinction coefficient k can be obtained. The nitrogen-free anti-reflective layer produced by this technique eliminates the mushrooming and footing problems found with conventional ARLs. See, e.g., FIG. 5.

It will be obvious to one skilled in the art, that the present invention may be practiced without some or all of these specific details. In other instances, well known process operations have not been described in detail in order not to unnecessarily obscure the present invention.

In one embodiment, the ARL is produced from silicon, oxygen, hydrogen, and carbon containing source gases or liquids, optionally with one or more inert gases, in a CVD system.

Preferred sources of silicon include silane, organosilicate compounds, for example, tetraethylorthosilicate (TEOS) or tetramethylorthosilicate (TMOS), or an organosilane, such as, tetramethylsilane or a phenylsilane. Fluorinated reactants such as silicon tetrafluoride may be used although fluorine is generally a less desirable film component. Organic groups on the organosilicate or organosilane precursors can be aromatic or aliphatic. Alternatively, mixtures of the aforementioned compounds, or mixed compounds, in which some organic substituents are bonded to silicon through an oxygen linkage and others are attached directly to silicon, such as alkylalkoxysilanes, are used as silicon precursors.

Suitable oxygen containing source gases and liquids include any source gas that contains oxygen and does not contain nitrogen. For example, suitable sources of oxygen include carbon dioxide, carbon monoxide, methanol, water, and the like. Elemental oxygen gas (usually in pure form) can also be used if TEOS is used as the silicon source.

The silicon and/or the oxygen source can also provide a source of carbon. Alternatively, a separate carbon source, such as methane, can be used in producing the ARL. Again, virtually any carbon source can be used provided that it does not contain nitrogen.

Generally, the silicon, oxygen, and/or the carbon source will also serve as a source of hydrogen. Alternatively, a separate hydrogen source, such as hydrogen gas, may be used in producing the ARL.

According to some embodiment, a non-reactive carrier gas is also used during deposition. Suitable inert gases include the Noble gases, such as neon, helium and argon.

ARL film composition and properties can be varied by modifying the gas flow rate, deposition pressure, deposition temperature, and RF power level. Generally, however, increasing oxygen content in the film will result in a more transparent ARL whereas increasing carbon and/or silicon content will produce a less transparent ARL.

Atomic concentrations of a representative nitrogen-free ARL of the present invention are: 2 to 20% hydrogen; 30 to 70% silicon; and 20 to 80% oxygen. For convenience the amounts of each ingredient are stated as round numbers. However, one skilled in the art will recognize that amounts within 10 or 20 percent of the stated values can also be expected to be appropriate, i.e., where 20% is stated, a range of from 16–18% to 22–24% is implicit and can be appropriate.

In accordance with this invention, the ARL will contain nitrogen below the detectable limit as measured using Secondary Ion Mass Spectrometry analysis (SIMS), and generally, will be about 1 ppm or less. Although preferably, the ARL film will contain no nitrogen, it will be appreciated that nitrogen may be present in the film to the extent that the release of $NH_x$ during or after deposition does not neutralize the photoacid catalyst or otherwise cause footing or mushrooming as described above.

In accordance with certain embodiments of this invention, the nitrogen-free ARL has an extinction coefficient ("k") of from about 0 to about 1.3 at 248 nm, and more preferably, of about 0.1 to about 0.8; and a refractive index ("n") of about 1.5 to about 3.0 and more preferably, of about 1.6 to about 2.2. (When the wavelength decreases, e.g., to 193 nm and beyond, the corresponding refractive index of a nitrogen-free ARL film will decrease and the extinction coefficient will increase.) The ARL will have a thickness of between about 100 and 5000 Angstroms.

The nitrogen-free ARL films of the invention are thermally and optically stable to the conditions typically used in semiconductor manufacturing; thus, the parameters of n, k, and t will not vary significantly throughout the semiconductor manufacturing process. The present invention can be used to be produced ARLs for use with radiation having a wavelength within the UV range, including wavelengths of 365 nm, 248 nm, 193 nm and beyond.

Chemical vapor deposition (CVD), plasma enhanced chemical vapor deposition (PECVD), high density plasma chemical vapor deposition (HDP-CVD), or other similar processes can be used to produce the ARL. See, e.g., U.S. Pat. No. 6,051,282, U.S. Pat. No. 6,251,770, U.S. Pat. No. 6,214,526, each of which is incorporated herein by reference. The film can be deposited in a single wafer reactor, multistation sequential deposition systems, or batch reactor.

The first step in the formation of an ARL of the invention is to place a substrate, typically a silicon wafer, on a pedestal in a CVD reactor. The total gas pressure in the CVD reactor chamber is typically between 0.1 mTorr and 100 Torr and is dependent on the type of deposition (e.g., PECVD or HDP-CVD), and more preferably, at about 3 Torr for PECVD depositions. The substrate temperature is typically in the range from about 200° C. to 500° C. or even upwards of 900° C. for front-end processes. While maintaining the substrate temperature and the reactor pressure below 100 Torr, process gas is introduced into the reactor. The process gas reacts on the surface of the substrate thereby depositing the anti-reflective layer.

Generally, the process gas is a gas mixture comprising silicon, oxygen, hydrogen, and/or carbon containing gases. In a preferred embodiment using silane and carbon dioxide as the source gases, the ratio of carbon dioxide to silane will typically be between about 5:1 and 100:1, and more preferably from about 25:1 to 75:1.

Flow rates of the gases will vary according to the reactant and film properties desired. More specifically, carbon dioxide can be introduced at a rate of from 2.5 $sccm/cm^2$ to 25 $sccm/cm^2$, preferably about 5 $sccm/cm^2$; and silane, at a rate of from about 0.01 $sccm/cm^2$ to about 0.5 $sccm/cm^2$, preferably about 0.06 to about 0.13 $sccm/cm^2$, and most preferably, at about 0.085 $sccm/cm^2$. All flow rates given above are based on per square centimeter of the wafer surface area.

The CVD process may be plasma enhanced. The process gas is ionized to enhance the deposition of the ARL, for example to increase the deposition rate. In plasma enhanced CVD, a radio frequency power is applied to sustain a plasma discharge for depositing a nitrogen-free ARL with desired properties and will vary depending on total flow. The radio frequency power is applied at a rate of from 0.5 $W/cm^2$ to 5.5 $W/cm^2$, preferably about 0.27 $W/cm^2$. In addition, a dual frequency PECVD system with both high and low frequency radio frequency power supplies can be used. The low frequency radio frequency power can be applied at a rate of from 0.05 to 1 $W/cm^2$.

The method of this invention is particularly useful in conjunction with a multiple-station CVD unit such as the Concept One, Concept One MAXUS™, Concept Two SEQUEL Express™, Concept Two Dual SEQUEL Express™, Concept Three SEQUEL™, and VECTOR™ System plasma-enhanced chemical vapor deposition (PECVD) units; or the Concept Two SPEED™, Concept Two SPEED/SEQUEL, or Concept Three SPEED™ high-density plasma (HDP) CVD units, each of which is manufactured by Novellus Systems, Inc. of San Jose, Calif. In such multi-station units, the anti-reflective layer is preferably deposited as a series of sublayers each of which is formed at a different processing station, as described in the commonly assigned application Ser. No. 08/987,905, filed Dec. 9, 1997 now abandoned, which is incorporated herein by reference in its entirety.

Nitrogen-free ARLs can be used at many masking levels to great advantage, such as for STI mask, gate electrode patterning, and as ARL/hard mask/polish stop combination in Damascene or Dual Damascene patterning. Other uses of the nitrogen-free ARLs described herein include etch stop layers and moisture barriers.

The methods and compositions described herein can be used in other semiconductor manufacturing applications. More specifically, in a shallow trench isolation ("STI") process, a silicon nitride layer is formed on a wafer and patterned to have openings where trenches will be formed in the substrate. STI masks often comprise a LPCVD SiN film which may then further require an ARL film. In accordance with this invention, a nitrogen-free ARL can replace both the SiN film of an STI mask as well as the conventional ARL film used with such masks. Alternatively, the ARL can be used on top of the SiN.

Similarly, a non-etching, hard mask layer can be deposited over the dielectric material to protect certain areas from plasma exposure. The nitrogen-free ARLs of the invention can be used as a hard mask layer instead of the more typical SiON, silicon nitride, or silicon carbide hard masks. Thus, the nitrogen-free ARL can serve as a combined ARL and hard mask.

Likewise, in DRAM technology, gate electrodes often consist of five layers: polysilicon; tungsten; SiN etch stop; oxide hard mask; and ARL. The number of layers in such a gate electrode can be reduced using the nitrogen-free ARL described herein as it can serve as a combined etch stop and hard mask; etch stop and ARL; hard mask and ARL; or even as a combined etch stop, hard mask, and ARL.

The nitrogen-free ARL of the present invention can also serve as a cap layer in single or dual damascene applications.

EXAMPLE 1

PECVD Deposition

A representative nitrogen-free ARL can be obtained with Novellus Sequel, a 6-station sequential PECVD system using 200 mm wafers at 400° C., by applying 530W RF plasma at 3.0 Torr pressure with 165 sccm silane and 9,700 sccm $CO_2$ flowing into the system, with 3 second deposition on each station. The ARL had the following properties:

| Film thickness (A), and Uniformity (1σ) | n at 248 nm, and Uniformity (1σ) | k at 248 nm, and Uniformity (1σ) | Nitrogen atomic concentration |
|---|---|---|---|
| 300, 1.2% | 1.86, 0.4% | 0.33, 1.4% | 0% |

Nitrogen-free ARL's having a thickness between 200 and 1000 Angstroms, n from 1.60 to 2.0 and k from 0.15 to 0.7 were produced on a variety of different film stacks comprising oxide, low K intermetal dielectric (IMD) layer, low k barrier layer, and copper.

The foregoing example is illustrative only and not limiting of the scope of this invention. For example, in some embodiments other oxygen-containing gases such as pure oxygen can be substituted for the $CO_2$. Pure oxygen may not be desirable, however, in typical PECVD processes where silane or another gas which reacts with oxygen in the absence of plasma is used before or after the formation of the surface layer. In such cases the chamber would have to be flushed of the reactive gas before the oxygen is introduced. Alternatively, if a dual plenum showerhead and low pressure are used, the hardware and process design issues associated with pure oxygen can be circumvented.

It will be understood that the embodiments described above are merely illustrative of the broad principles of this invention, and not limiting. Many alternative and additional embodiments of this invention will be apparent to those skilled in the art.

What is claimed is:

1. A method of fabricating an anti-reflective layer of a dual damascene device in a chemical vapor deposition chamber, the method comprising the steps of:

forming a first layer of dielectric that is to be patterned;

forming an anti-reflective layer over the first layer using a source comprising a silane and a carbon oxide, wherein the anti-reflective layer is substantially nitrogen-free and comprises between about 20% and 80% oxygen;

patterning the first layer to define a dual damascene via; and filling said via with photoresist that contacts the anti-reflective layer.

2. The method of claim 1 wherein forming an anti-reflective layer comprises introducing gas or liquid sources of carbon, hydrogen, silicon, and oxygen.

3. The method of claim 2 wherein oxygen source comprises elemental oxygen, carbon monoxide, or carbon dioxide.

4. The method of claim 2 wherein forming an anti-reflective layer comprises introducing carbon dioxide at a flow rate of from 2.5 sccm to 25 sccm per square centimeter of the surface of the anti-reflective layer.

5. The method of claim 2 wherein forming an anti-reflective layer comprises introducing silane at a flow rate of from 0.01 sccm to 0.5 sccm per square centimeter of the surface of the anti-reflective layer.

6. The method of claim 2 wherein forming an anti-reflective layer comprises introducing carbon dioxide at a flow rate of from 2.5 sccm to 25 sccm per square centimeter of the surface of the anti-reflective layer and silane at a flow rate of from 0.01 sccm to 0.5 sccm per square centimeter of the surface of the anti-reflective layer.

7. The method of claim 2, wherein forming an anti-reflective layer further comprises applying radio frequency power in the chemical vapor deposition chamber at a power intensity of from 0.05 W to 5.5 W per square centimeter of the surface of the anti-reflective layer.

8. The method of claim 1, further comprising:

depositing a photoresist on top of the anti-reflective layer;

exposing the photoresist to radiation defining a pattern to be imposed on the first layer; and developing the photoresist.

9. The method of claim 1 wherein forming the anti-reflective layer comprises introducing the gas reactants into the chemical vapor deposition chamber to between about 0.1 mTorr and 100 Torr.

10. The method of claim 1 wherein forming the anti-reflective layer comprises using plasma enhanced chemical vapor deposition (PECVD) methods.

11. The method of claim 1 wherein forming the anti-reflective layer comprises using a substrate deposition temperature between about 200 and 900 degrees Celsius.

12. The method of claim 1 wherein the total gas flow rate is about 5.2 sccm per square centimeter area of processed wafer.

13. The method of claim 1 wherein the extinction coefficient for the anti-reflective layer is between about 0 and 1.3 at 248 nm.

14. The method of claim 1 wherein the dual damascene device comprises a low k dielectric layer.

15. A method for improving a damascene process for metallization, said method comprising:

forming a low-k dielectric layer on a semiconductor substrate;

forming an anti-reflective layer on said low-k dielectric layer using a source comprising a silane and a carbon oxide, wherein said anti-reflective layer comprises substantially no nitrogen and comprises between about 20% and 80% oxygen;

patterning said low-k dielectric layer, thereby forming interconnect line regions in said low-k dielectric layer; and forming a conductive layer in said interconnect line regions.

16. The method of claim 15, wherein the forming of the anti-reflective layer is performed in a high density plasma chemical vapor deposition reactor.

17. The method of claim 15 wherein forming the anti-reflective layer comprises using a substrate deposition temperature between about 200 and 900 degrees Celsius.

18. A method of fabricating an anti-reflective layer in a chemical vapor deposition chamber, the method comprising the steps of:

forming a first layer of dielectric that is to be patterned;

forming an anti-reflective layer over the first layer using a source comprising a silane and a carbon oxide, wherein the anti-reflective layer is substantially nitrogen-free and comprises between about 20% and 80% oxygen.

* * * * *